United States Patent
Cheng

(10) Patent No.: US 7,417,905 B2
(45) Date of Patent: Aug. 26, 2008

(54) APPARATUS AND RELATED METHOD FOR CONTROLLING SWITCH MODULE IN MEMORY BY DETECTING OPERATING FREQUENCY OF SPECIFIC SIGNAL IN MEMORY

(75) Inventor: Wen-Chang Cheng, Tao-Yuan (TW)

(73) Assignee: Nanya Technology Corp., Kueishan, Tao-Yuan Hsein (TW)

( * ) Notice: Subject to any disclaimer, the term of this patent is extended or adjusted under 35 U.S.C. 154(b) by 157 days.

(21) Appl. No.: 11/563,213

(22) Filed: Nov. 27, 2006

(65) Prior Publication Data

US 2008/0062781 A1 Mar. 13, 2008

(30) Foreign Application Priority Data

Sep. 8, 2006 (TW) .............................. 95133206 A

(51) Int. Cl.
G11C 7/00 (2006.01)
(52) U.S. Cl. ...................................... 365/191; 365/194
(58) Field of Classification Search ................ 365/191, 365/194, 223.1; 327/157, 160, 117, 47
See application file for complete search history.

(56) References Cited

U.S. PATENT DOCUMENTS

| 6,285,722 | B1 * | 9/2001 | Banwell et al. ............. 375/354 |
| 2002/0163851 | A1 * | 11/2002 | Jeong ......................... 365/233 |
| 2003/0071668 | A1 * | 4/2003 | Starr ........................... 327/157 |

FOREIGN PATENT DOCUMENTS

| KR | 10-2005-0055228 | 6/2005 |
| KR | 10-2005-0095688 | 9/2005 |

\* cited by examiner

Primary Examiner—Vu A Le
(74) Attorney, Agent, or Firm—Winston Hsu

(57) ABSTRACT

An apparatus for controlling a switch module in a memory is disclosed. A first pulse width adjusting unit receives an input instruction signal and adjusts a pulse width of the input instruction signal to generate an adjusted input instruction signal according to a first pulse width adjustment. A decoder receives an input address signal and the adjusted input instruction signal to generate a control signal utilized for controlling a turn-on period of the switch module. A second pulse width adjusting unit receives the control signal and adjusts a pulse width of the control signal to generate an adjusted control signal according to a second pulse width adjustment. A frequency detector controls the first and second pulse width adjusting units to set the first and second pulse width adjustments according to a frequency of a specific signal in the memory.

18 Claims, 2 Drawing Sheets

APPARATUS AND RELATED METHOD FOR CONTROLLING SWITCH MODULE IN MEMORY BY DETECTING OPERATING FREQUENCY OF SPECIFIC SIGNAL IN MEMORY

BACKGROUND OF THE INVENTION

1. Field of the Invention

The present invention relates to a method for controlling memory data access, and more particularly, to an apparatus and related method for adjusting a pulse width to generate a control signal for controlling a switch module on a data transmission path in a memory by detecting a frequency of a specific clock signal in the memory.

2. Description of the Prior Art

In general, when accessing a sum of data, a microprocessor will send an input instruction signal (e.g. a data read instruction signal or a data write instruction signal) to a memory (e.g. a DRAM {Dynamic Random Access Memory}) for informing the memory a data access operation will be performed. It is also necessary for the microprocessor to send an input address signal corresponding to the sum of data to the memory such that the memory can access the sum of data according to the input address signal correctly. Before the sum of data is accessed, a decoder performs a decoding operation upon the input address signal and the input instruction signal simultaneously to output a control signal for controlling a turn-on period of a switch module in the memory so memory data can be accessed through the switch module. For example, data in memory cells within a specific memory bank in the memory can be accessed through the switch module when the switch module is turned on. Additionally, since the input instruction signal or the input address signal is usually inputted into the memory in the form of a voltage signal, the memory needs to use corresponding pins to receive the above-mentioned voltage signals. As mentioned above, the voltage signal has a high voltage level (e.g. five Volts) or a low voltage level (e.g. zero Volts). The memory also needs an operating clock signal (i.e. a memory clock). The operating clock signal is utilized for estimating the voltage level corresponding to the input address signal in order to obtain information of the input address signal for performing a memory data access operation. For example, a voltage level of the voltage signal corresponding to the input address signal can be estimated on a rising edge or a falling edge of the operating clock signal.

In practice, however, because high frequency variations of the above-mentioned voltage signals will become non-ideal while the operating clock signal in the memory operates at a higher frequency, errors may occur when the memory performs instructions for estimating the voltage level of the voltage signal representative of the input address signal. Please refer to FIG. 1. FIG. 1 shows a timing diagram controlling a switch module in a prior art memory for data access. A signal CTRL is utilized for controlling the switch module to be turned on or turned off and also for controlling the turn-on period of the switch module. As shown in FIG. 1, a signal CLK represents the operating clock signal in the memory, and a signal ADDR represents the input address signal. A signal COM represents an input instruction signal (e.g. a data read instruction signal or a data write instruction signal), and a data access operation will be performed when a voltage level of the input instruction signal COM arrives at a high voltage level. For example, when the operating clock signal CLK in the memory remains in an ideal frequency range (i.e. it is assumed that, in this frequency range, high frequency variations of the input address signal ADDR are still ideal), it is only necessary for a pulse width $PW_2$ of the input instruction signal COM to be shorter than a pulse width $PW_1$ of the input address signal ADDR. A setup time taken by a rising edge of the input address signal ADDR and a hold time taken by a falling edge of the input address signal ADDR are not considered. Otherwise, when the operating clock signal CLK in the memory arrives at a higher frequency (i.e. it is assumed that, at this frequency, high frequency variations of the input address signal ADDR are not ideal), in order for there to be no errors, the setup time taken by the rising edge of the input address signal ADDR and the hold time taken by the falling edge of the input address signal ADDR have to be considered for preventing the decoder from accessing other addresses. Therefore, it is necessary for the pulse width $PW_2$ of the input instruction signal COM to not only be smaller than the pulse width $PW_1$ of the input address signal ADDR, but also a fixed pulse width is needed to be reserved for the setup/hold time taken by the rising/falling edge of the input address signal ADDR. For example, in FIG. 1, the pulse width $PW_2$ is much shorter than the pulse width $PW_1$. Since the pulse width $PW_3$ of the control signal CTRL is determined by the pulse width $PW_2$ of the input instruction signal COM, however, this method of reserving a fixed pulse width will result in a shorter turn-on period of the switch module when using the control signal CTRL outputted from the decoder to control the switch module. The shorter turn-on period of the switch module will cause a shorter data access time. This shorter data access time will become more serious if the reserved pulse width is longer.

SUMMARY OF THE INVENTION

Therefore one of the objectives of the present invention is to provide an apparatus and related method for adjusting at least a pulse width to generate a control signal for controlling the switch module according to an operating frequency in a memory, to solve the above-mentioned problem.

According to the claimed invention, an apparatus for controlling a switch module in a memory is disclosed. The apparatus comprises a first pulse width adjusting unit, a second pulse width adjusting unit, a decoder, and a frequency detector. The first pulse width adjusting unit is utilized for receiving an input instruction signal and adjusting a pulse width of the input instruction signal to generate an adjusted input instruction signal according to a first pulse width adjustment. The decoder is coupled to the first pulse width adjusting unit and utilized for receiving an input address signal and the adjusted input instruction signal to generate a control signal utilized for controlling a turn-on period of the switch module for memory data access through the switch module. The second pulse width adjusting unit is utilized for receiving the control signal and adjusting a pulse width of the control signal to generate an adjusted control signal for controlling the switch module according to a second pulse width adjustment. The frequency detector is coupled to the first pulse width adjusting unit and the second pulse width adjusting unit, and is utilized for detecting a frequency of a specific signal in the memory for controlling the first and second pulse width adjusting units to set the first and second pulse width adjustments.

According to the claimed invention, a method for controlling a switch module in a memory is disclosed. The method comprises: receiving an input instruction signal and adjusting a pulse width of the input instruction signal to generate an adjusted input instruction signal according to a first pulse width adjustment; receiving an input address signal and the adjusted input instruction signal to generate a control signal for controlling a turn-on period of the switch module for memory data access through the switch module; receiving the control signal and adjusting a pulse width of the control signal to generate an adjusted control signal for controlling the switch module according to a second pulse width adjustment; and detecting a frequency of a specific signal in the memory to set the first and second pulse width adjustments.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
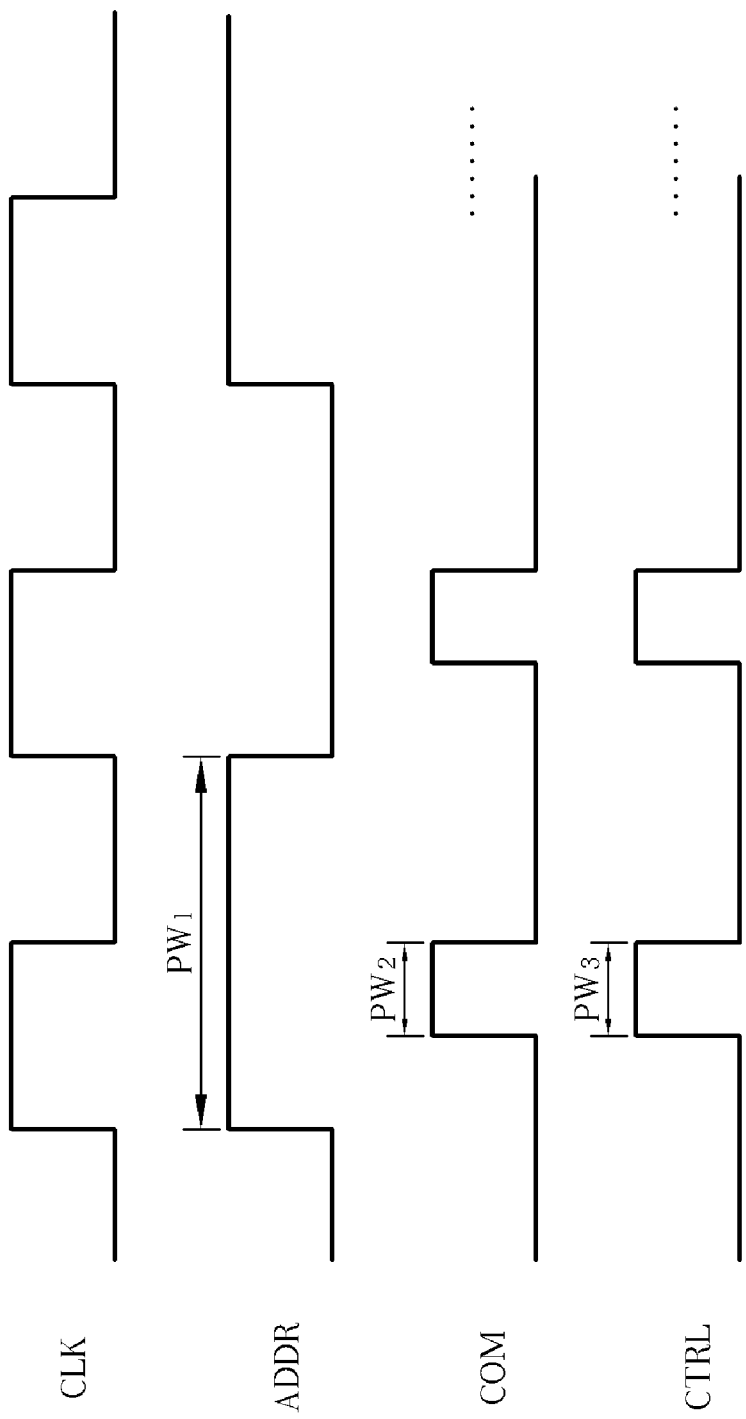
FIG. 1 shows a timing diagram controlling a switch module for data access in a prior art memory.
Figure 2:
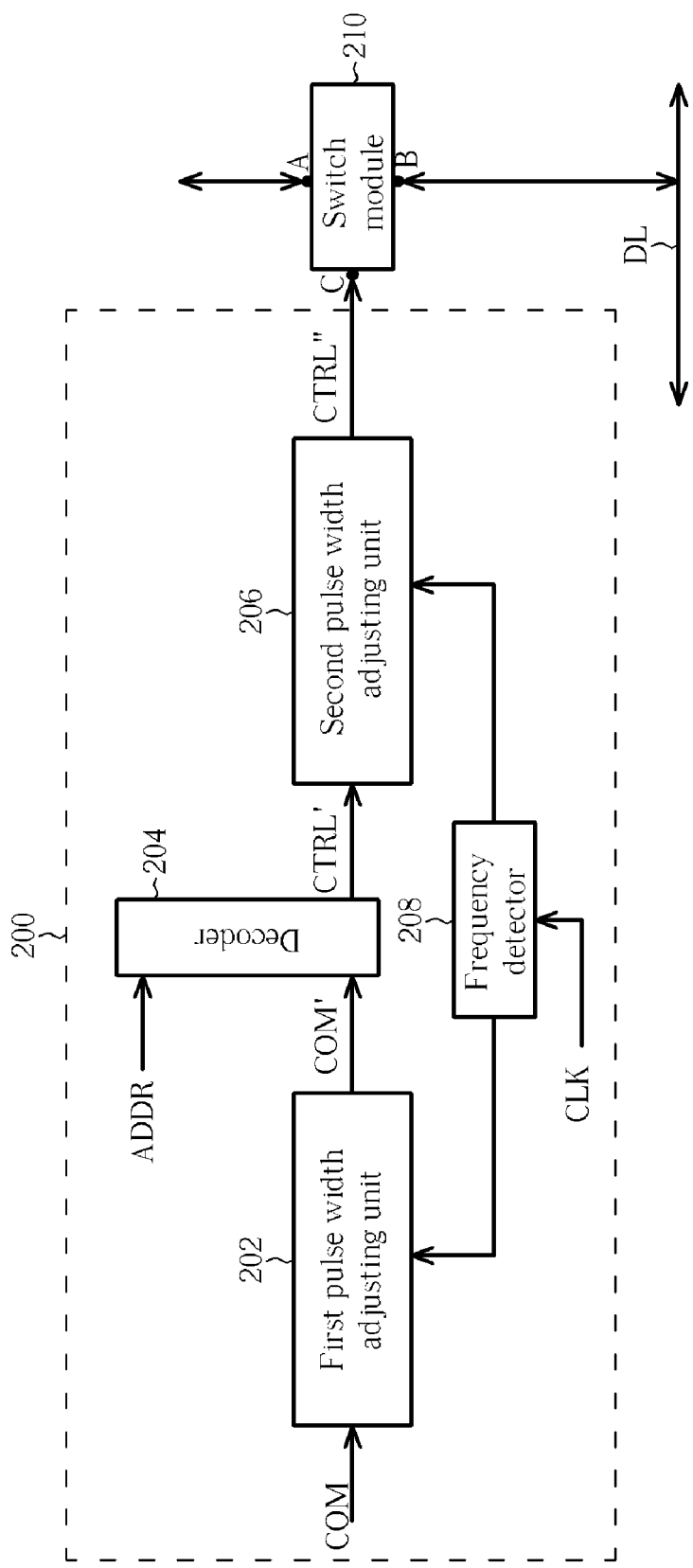
FIG. 2 is a diagram of an apparatus for controlling a switch module according to an embodiment of the present invention.

Please refer to FIG. 2. FIG. 2 is a diagram of an apparatus 200 for controlling a switch module 210 according to an embodiment of the present invention. In this embodiment, the apparatus 200 and the switch module 210 are both positioned in a memory (not shown in FIG. 2). As shown in FIG. 2, the apparatus 200 comprises a first pulse width adjusting unit 202, a decoder 204, a second pulse width adjusting unit 206, and a frequency detector 208. The first pulse width adjusting unit 202 is utilized for adjusting a pulse width of an input instruction signal COM to generate an adjusted input instruction signal COM' according to a first pulse width adjustment. The decoder 204 is utilized for receiving an input address signal ADDR and an adjusted input instruction signal COM' to generate a control signal CTRL' for controlling the switch module 210. The second pulse width adjusting unit 206 is utilized for receiving a control signal CTRL' outputted from the decoder 204 and for adjusting a pulse width of the control signal CTRL' to generate an adjusted control signal CTRL" for controlling an on/off status of the switch module 210 according to a second pulse width adjustment. The switch module 210 comprises a control terminal C and a plurality of data terminals A, B. When the control terminal C receives the adjusted control signal CTRL" and an electronic connection between the data terminals A, B is established through the switch module 210, a sum of data received by the data terminal A can be written into a memory cell in a specific memory bank in the memory through the data terminal B and a data line DL, or a sum of data stored in a memory cell in a specific memory bank in the memory can be read out and transmitted to the data terminal A through the data terminal B and the data line DL. The frequency detector 208 is utilized for controlling the first pulse width adjusting unit 202 to set the first pulse width adjustment and controlling the second pulse width adjusting unit 206 to set the second pulse width adjustment according to a frequency of a specific signal in the memory (e.g. a frequency of the operating clock signal CLK in the memory). It should be noted that, in this embodiment, the first pulse width adjusting unit 202 and the second pulse width adjusting unit 206 are implemented with controllable delay units. The first pulse width adjustment and the second pulse width adjustment are delay amounts controlled by the first pulse width adjusting unit 202 and the second pulse width adjusting unit 206 respectively; however, this is not a limitation of the present invention. Other schemes for adjusting pulse widths are also suitable for the first pulse width adjusting unit 202 and the second pulse width adjusting unit 206.

In this embodiment, the frequency detector 208 controls the first pulse width adjusting unit 202 to set the first pulse width adjustment as a delay amount $D_1$ and controls the second pulse width adjusting unit 206 to set the second pulse width adjustment as a delay amount $D_2$ when detecting that the operating clock signal CLK in the memory 200 corresponds to a frequency $F_1$. The first pulse width adjusting unit 202 then adjusts the pulse width of the input instruction signal COM to generate an adjusted input instruction signal COM' according to the delay amount $D_1$. The decoder 204 receives the input address signal ADDR and the adjusted input instruction signal COM' to perform a decoding operation to output the control signal CTRL'. The second pulse width adjusting unit 206 adjusts the pulse width of the control signal CTRL' to generate the adjusted control signal CTRL" for controlling the turn-on period of the switch module 210 (i.e. the data access time) according to the delay amount $D_2$. As mentioned above, the control signal CTRL' is adjusted by the delay amount $D_2$ such that the pulse width of the adjusted control signal CTRL" is longer than that of the control signal CTRL'. On the other hand, the frequency detector 208 controls the first pulse width adjusting unit 202 to set the first pulse width adjustment as another delay amount $D_3$ and controls the second pulse width adjusting unit 206 to set the second pulse width adjustment as another delay amount $D_4$ when detecting that the operating clock signal CLK in the memory 200 corresponds to a frequency $F_2$ higher than the frequency $F_1$. The delay amount $D_3$ is shorter than the delay amount $D_1$, and the delay amount $D_4$ is longer than the delay amount $D_2$.

When the operating clock signal CLK operates at a higher frequency (compared to the previous one), it is necessary for the first pulse width adjustment to become shorter than the previous first pulse width adjustment for reserving a longer period for the setup time taken by the rising edge of the input address signal ADDR and the hold time taken by the falling edge of the input address signal ADDR to prevent errors from occurring. Additionally, it is also necessary for the second pulse width adjustment to become longer than the previous second pulse width adjustment such that the pulse width of the control signal CTRL' can be extended to a longer one and the data access time through the switch module 210 (i.e. the turn-on period of the switch module 210) will become longer. Therefore, the shorter data access time problem of the prior art can be solved. Please note that any method for detecting the operating clock signal CLK and any scheme for accomplishing the above-mentioned pulse width adjusting unit also falls within the scope of the present invention. In another embodiment, the second pulse width adjusting unit 206 is removed (i.e. the frequency detector 208 only controls the first pulse width adjusting unit 202 to set the first pulse width adjustment), and errors resulting from the non-ideal high frequency variations while the operating clock signal CLK operates at a higher frequency can also be avoided even though the problem caused by the shorter data access time is not solved. This also obeys the spirit of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An apparatus for controlling a switch module in a memory, comprising:
   a first pulse width adjusting unit, for receiving an input instruction signal and adjusting a pulse width of the input instruction signal to generate an adjusted input instruction signal according to a first pulse width adjustment;

a decoder, coupled to the first pulse width adjusting unit, for receiving an input address signal and the adjusted input instruction signal to generate a control signal utilized for controlling a turn-on period of the switch module for memory data access through the switch module; and a frequency detector, coupled to the first pulse width adjusting unit, for detecting a frequency of a specific signal in the memory to control the first pulse width adjusting unit to set the first pulse width adjustment.

2. The apparatus of claim 1, wherein the specific signal is an operating clock signal of the memory.

3. The apparatus of claim 1, wherein the first pulse width adjusting unit is a controllable delay unit, and the first pulse width adjustment is a delay amount utilized for adjusting a pulse width; the frequency detector controls the first pulse width adjusting unit to set the first pulse width adjustment as a first delay amount when the specific signal corresponds to a first frequency; and the frequency detector controls the first pulse width adjusting unit to set the first pulse width adjustment as a second delay amount shorter than the first delay amount when the specific signal corresponds to a second frequency higher than the first frequency.

4. The apparatus of claim 3, further comprising:

a second pulse width adjusting unit, coupled to the decoder and the frequency detector, for receiving the control signal inputted from the decoder and for adjusting a pulse width of the control signal to generate an adjusted control signal for controlling the switch module according to a second pulse width adjustment; wherein the frequency detector further controls the second pulse width adjusting unit to set the second pulse width adjustment according to the frequency of the specific signal.

5. The apparatus of claim 4, wherein the second pulse width adjusting unit is a controllable delay unit, and the second pulse width adjustment is a delay amount utilized for adjusting a pulse width; the frequency detector controls the second pulse width adjusting unit to set the second pulse width adjustment as a third delay amount when the specific signal corresponds to the first frequency; and the frequency detector controls the second pulse width adjusting unit to set the second pulse width adjustment as a fourth delay amount longer than the third delay amount when the specific signal corresponds to the second frequency.

6. The apparatus of claim 4, wherein the specific signal is an operating clock signal of the memory.

7. The apparatus of claim 1, further comprising:

a second pulse width adjusting unit, coupled to the decoder and the frequency detector, for receiving the control signal inputted from the decoder and for adjusting a pulse width of the control signal to generate an adjusted control signal for controlling the switch module according to a second pulse width adjustment; wherein the frequency detector further controls the second pulse width adjusting unit to set the second pulse width adjustment according to the frequency of the specific signal.

8. The apparatus of claim 7, wherein the second pulse width adjusting unit is a controllable delay unit, and the second pulse width adjustment is a delay amount utilized for adjusting a pulse width; the frequency detector controls the second pulse width adjusting unit to set the second pulse width adjustment as a third delay amount when the specific signal corresponds to a first frequency; and the frequency detector controls the second pulse width adjusting unit to set the second pulse width adjustment as a fourth delay amount longer than the third delay amount when the specific signal corresponds to a second frequency higher than the first frequency.

9. The apparatus of claim 7, wherein the specific signal is an operating clock signal of the memory.

10. A method for controlling a switch module in a memory, comprising:

receiving an input instruction signal and adjusting a pulse width of the input instruction signal to generate an adjusted input instruction signal according to a first pulse width adjustment;

receiving an input address signal and the adjusted input instruction signal to generate a control signal for controlling a turn-on period of the switch module for memory data access through the switch module; and detecting a frequency of a specific signal in the memory to set the first pulse width adjustment.

11. The method of claim 10, wherein the specific signal is an operating clock signal of the memory.

12. The method of claim 10, wherein the step of detecting the frequency of the specific signal in the memory to set the first pulse width adjustment comprises:

providing a first controllable delay unit where the first pulse width adjustment is a delay amount utilized for adjusting a pulse width;

controlling the first controllable delay unit to set the first pulse width adjustment as a first delay amount when the specific signal corresponds to a first frequency; and controlling the first controllable delay unit to set the first pulse width adjustment as a second delay amount shorter than the first delay amount when the specific signal corresponds to a second frequency higher than the first frequency.

13. The method of claim 12, further comprising:

receiving the control signal and adjusting a pulse width of the control signal to generate an adjusted control signal for controlling the switch module according to a second pulse width adjustment; and setting the second pulse width adjustment according to the frequency of the specific signal.

14. The method of claim 13, wherein the step of setting the second pulse width adjustment according to the frequency of the specific signal comprises:

providing a second controllable delay unit where the second pulse width adjustment is a delay amount utilized for adjusting a pulse width;

controlling the second controllable delay unit to set the second pulse width adjustment as a third delay amount when the specific signal corresponds to the first frequency; and controlling the second controllable delay unit to set the second pulse width adjustment as a fourth delay amount longer than the third delay amount when the specific signal corresponds to the second frequency.

15. The method of claim 13, wherein the specific signal is an operating clock signal of the memory.

16. The method of claim 10, further comprising:

receiving the control signal and adjusting a pulse width of the control signal to generate an adjusted control signal for controlling the switch module according to a second pulse width adjustment; and setting the second pulse width adjustment according to the frequency of the specific signal.

17. The method of claim 16, wherein the step of setting the second pulse width adjustment according to the frequency of the specific signal comprises:

providing a second controllable delay unit where the second pulse width adjustment is a delay amount utilized for adjusting a pulse width;

controlling the second controllable delay unit to set the second pulse width adjustment as a third delay amount when the specific signal corresponds to a first frequency; and controlling the second controllable delay unit to set the second pulse width adjustment as a fourth delay amount longer than the third delay amount when the specific signal corresponds to a second frequency higher than the first frequency.

18. The method of claim 16, wherein the specific signal is an operating clock signal of the memory.

* * * * *

UNITED STATES PATENT AND TRADEMARK OFFICE
CERTIFICATE OF CORRECTION

PATENT NO. : 7,417,905 B2 Page 1 of 1
APPLICATION NO. : 11/563213
DATED : August 26, 2008
INVENTOR(S) : Wen-Chang Cheng It is certified that error appears in the above-identified patent and that said Letters Patent is hereby corrected as shown below:

On the title page, item (73), correct the residence of the assignee from "Tao-Yuan Hsein" to --Tao-Yuan Hsien--

Signed and Sealed this

Fourth Day of November, 2008

JON W. DUDAS
*Director of the United States Patent and Trademark Office*